United States Patent [19]

Yasuda et al.

[11] Patent Number: 4,950,910
[45] Date of Patent: Aug. 21, 1990

[54] ELECTRON BEAM EXPOSURE METHOD AND APPARATUS

[75] Inventors: Hiroshi Yasuda, Yokohama; Junichi Kai, Tokyo; Shinji Miyaki, Tokushima; Yasushi Takahashi, Kawasaki, all of Japan

[73] Assignee: Fujitsu Limited, Kawasaki, Japan

[21] Appl. No.: 304,242

[22] Filed: Jan. 31, 1989

[30] Foreign Application Priority Data

Feb. 4, 1988 [JP] Japan ............................. 63-22795

[51] Int. Cl.⁵ .............................................. H01J 37/302
[52] U.S. Cl. ............................. 250/492.3; 250/492.2; 250/398; 364/489; 364/490; 364/491
[58] Field of Search ............... 250/492.22, 492.2, 398; 364/488, 489, 490, 491

[56] References Cited

U.S. PATENT DOCUMENTS

| | | | |
|---|---|---|---|
| 4,259,724 | 3/1981 | Sugiyama | 250/492.22 |
| 4,280,186 | 7/1981 | Hidai et al. | 250/492.22 |
| 4,362,942 | 12/1982 | Yasuda | 250/492.2 |
| 4,365,163 | 12/1982 | Davis et al. | 250/492.2 |
| 4,410,800 | 10/1983 | Yoshikawa | 250/492.22 |
| 4,625,121 | 11/1986 | Hamaguchi | 250/492.22 |
| 4,647,782 | 3/1987 | Wada et al. | 250/492.22 |
| 4,728,797 | 3/1988 | Gotori et al. | 250/492.22 |
| 4,743,766 | 5/1988 | Nakasuji et al. | 250/492.22 |
| 4,818,885 | 4/1989 | Davis et al. | 250/492.2 |
| 4,823,012 | 4/1989 | Kosugi | 250/492.2 |

Primary Examiner—Janice A. Howell
Assistant Examiner—Kiet T. Nguyen
Attorney, Agent, or Firm—Staas & Halsey

[57] ABSTRACT

A method for depicting a pattern on a sample having a plurality of exposure areas placed on a movable stage by irradiating an electron beam. A pattern density is calculated from data of a pattern to be exposed for every exposure area on the sample. Next, the calculated pattern density is compared with a predetermined pattern density. Then when the calculated pattern density in a first exposure area contained in said exposure pattern area is less than the predetermined pattern density, the pattern is depicted therein by a continuous stage moving process. On the other hand, when the calculated pattern density in a second exposure area contained in the exposure areas is equal or greater than the predetermined pattern density, the pattern is depicted therein by a step and repeat process.

15 Claims, 4 Drawing Sheets

ELECTRON BEAM EXPOSURE METHOD AND APPARATUS

BACKGROUND OF THE INVENTION (1) Field of the Invention

The present invention generally relates to an electron beam exposure method and an apparatus for carrying out the same. In particular, the present invention is directed to an electron beam exposure method and an apparatus for carrying out the same, in which the step and repeat system and the continuous stage moving system are combined.

(2) Description of the Related Art

The electron beam exposure system is known as a system for forming minute patterns for a large scale integrated circuit (LSI). An example of the electron beam exposure system is the step and repeat system. In the step and repeat system, an electron beam is deflected and irradiated only on an exposure area on a surface of a sample such as a semiconductor wafer placed on a stage kept stationary during exposure. After exposure, the stage is shifted by a predetermined length, and the electron beam is deflected and irradiated on the next exposure area. The above-mentioned procedure is repetitively carried out, whereby desired patterns are depicted on the wafer.

Since the electron beam is not projected onto an area except for exposure areas, there is no serious problem with respect to an exposure time, even when patterns have a high pattern density and a low pattern density. On the other hand, the exposure is not performed during a time when the stage moves. For this reason, a reduced exposure time is not obtainable in a case where patterns having the same pattern density are exposed.

Recently, a continuous stage moving system has been proposed which takes into consideration the above-mentioned viewpoint. See, for example, U.S. Pat. No. 4,362,942. In the proposed continuous stage moving system, patterns are depicted by irradiating the electron beam onto the wafer while the stage is always moved continuously. According to this system, it is possible to obtain the exposure time shorter than that obtainable by the step and repeat system.

However, the proposed continuous stage moving system must select the continuous stage moving speed, depending on the pattern density. FIG. 1 is a a wafer 1 which has areas 2 having relatively low pattern density, and areas such as a test pattern area 3 and an alignment area 4 having extremely high density. The pattern density of the above mentioned wafer 1 changes as shown in the graph of FIG. 2. In order to form patterns on the wafer 1, it is necessary to select an optimum continuous stage moving speed for every pattern position. However, in actuality it is very difficult to do the above. For this reason, in practical operation, a stage continuous moving speed is fixedly selected which makes it possible to depict the area having the maximum pattern density. However, the above has a shortcoming in which the essential feature of the continuous stage moving system, namely, high-speed exposure is lost because of an existence of lower density pattern areas.

SUMMARY OF THE INVENTION

It is therefore a general object of the present invention to provide an electron beam exposure method and an apparatus for carrying out the same in which the aforementioned disadvantages are eliminated.

A more specific object of the present invention is to provide an electron beam exposure method and apparatus capable of depicting patterns having various pattern densities on a wafer at an increased speed.

The above objects of the present invention can be achieved by a method for depicting a pattern on a sample having a plurality of exposure areas placed on a movable stage by irradiating an electron beam, comprising the following steps. A pattern density in each exposure area is calculated from data of a pattern to be exposed. Next, the calculated pattern density is compared with a predetermined threshold value. Then, the pattern in a first exposure area is depicted by a continuous stage moving process, when the calculated pattern density in the first exposure area is less than the predetermined threshold value. On the other hand, when the calculated pattern density in the second exposure area is equal or greater than the predetermined threshold value, the pattern in a second exposure is depicted by a step and repeat process.

The above objects of the present invention can also be achieved by an electron beam exposure apparatus for depicting a pattern on a sample having a plurality of exposure areas by irradiating an electron beam onto the sample, including a stage on which the sample is placed, an electron beam generator for generating the electron beam, deflectors for deflecting the electron beam generated by the electron beam generator, a deflection signal generator for providing the deflectors with a deflection signal based on a pattern data relating to the pattern to be exposed, a stage drive mechanism for driving the stage, and a control mechanism for discriminating whether or not a pattern density obtained from the pattern data is equal to or greater than a predetermined threshold value. The control mechanism then supplies the stage drive mechanism with a control signal so as to intermittently move the stage when the obtained pattern density is equal to or higher than the predetermined threshold value and supplies the stage drive mechanism with the control signal so as to continuously move the stage when the obtained pattern density is less than the predetermined threshold value.

Other objects, features and advantages of the present invention will become apparent from the following detailed description when read in conjunction with the accompanying drawings.

DESCRIPTION OF THE PREFERRED EMBODIMENTS

Figure 1:
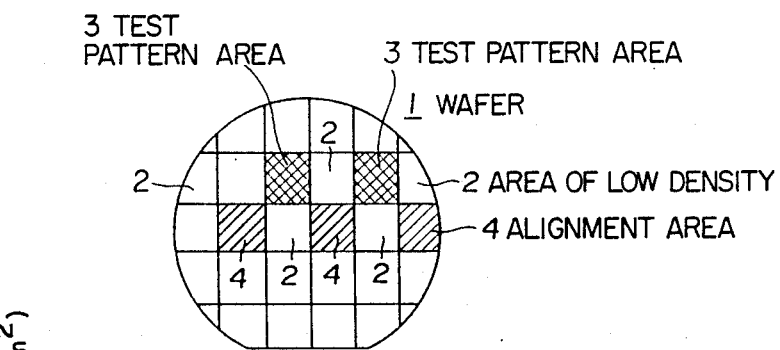
FIG. 1 is a diagrams of pattern areas to be depicted on a wafer.
Figure 2:
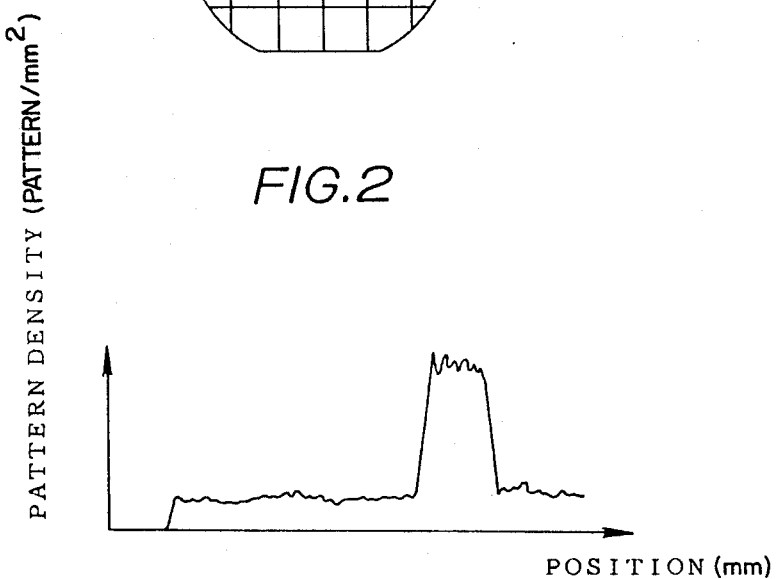
FIG. 2 is a graph of the changes in pattern density on the wafer in FIG. 1.
Figure 3:
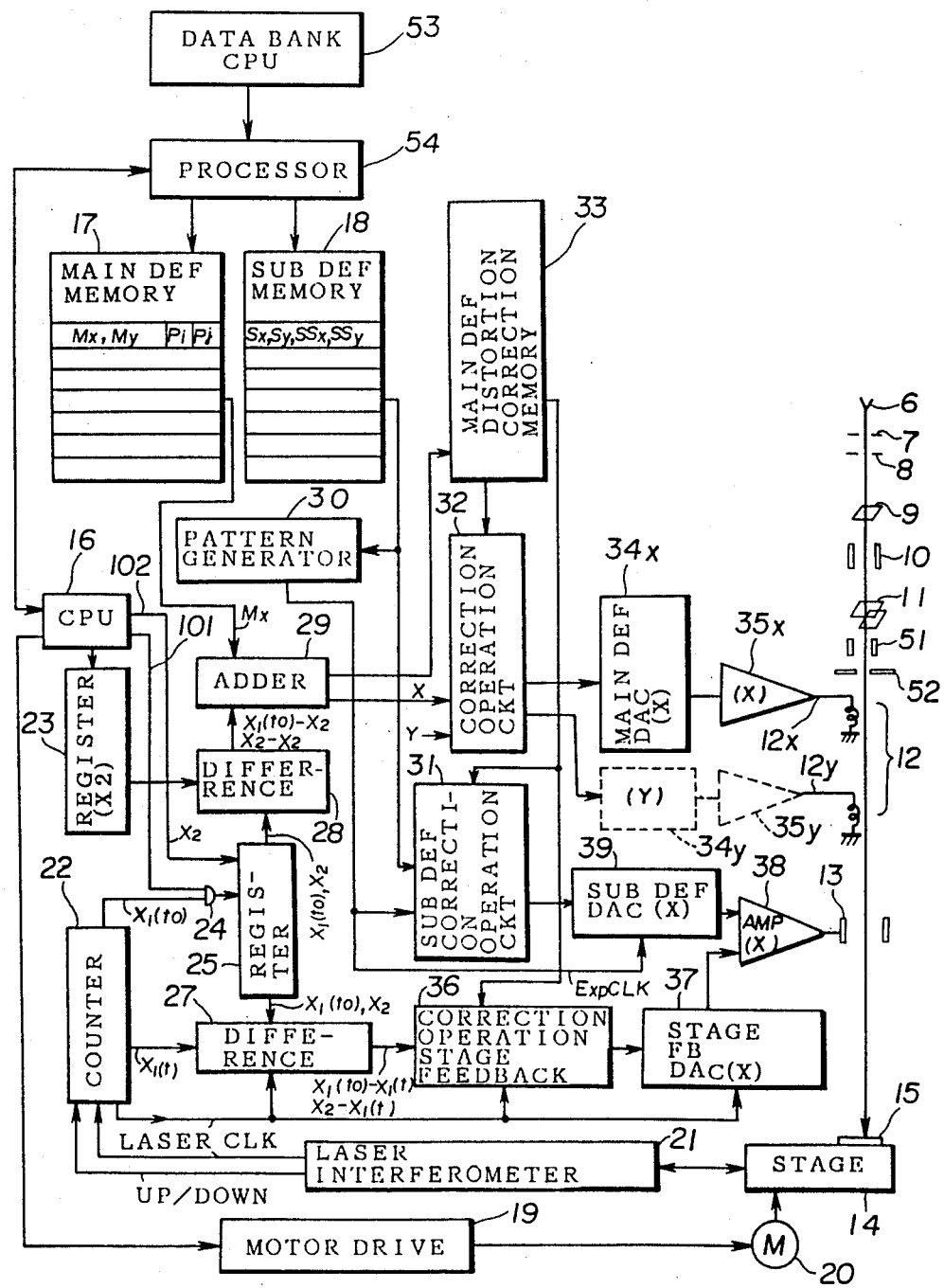
FIG. 3 is a block diagram of a preferred embodiment according to the present invention.

A description is given of the preferred embodiment of the present invention with reference to FIG. 3. Referring to FIG. 3, an electron beam is emitted from an electron gun which includes a cathode 6, a grid 7 and an anode 8. The emitted electron beam passes through a first slit 9, a deflector 10 for changing the beam size, a second slit 11 for shaping the electron beam into a rectangular shape, coils 12x and 12y forming a main deflector 12, and an electrode 13 forming a sub deflector 13, a blanking deflector 51 and, a blanking aperture 52, and is finally projected onto a wafer 15 placed on a stage 14. The rectangular electron beam is a size-variable beam. The main deflector 12 consisting of the coils 12x and 12y functions to deflect the electron beam in X and Y directions with a large deflection amount corresponding to a value equal to or less than approximately 10 mm. An area which can be covered by the electron beam deflected by the main deflector 12, is defined as a main field. The main field comprises a plurality of sub fields. The sub deflector consisting of the electrode 13 functions to deflect the electron beam in the X direction with a small deflection amount corresponding to a value equal to or less than approximately 100 μm. Patterns within each sub field can be depicted by deflecting the electron beam by the sub deflector 13.

It is noted that for the sake of simplicity, in FIG. 3, a sub deflector for scanning the electron beam in the Y direction on the wafer 15, and a related control system are omitted. However, in practical use, those parts are necessary to construct the electron beam exposure apparatus.

A main deflection memory 17 stores pattern data Mx, My which indicates a coordinate in a main field. A sub deflection memory 18 stores pattern data Sx, Sy which indicates a coordinate in a sub field. The main deflection memory 17 also stores pointers Pi and Pj which indicate a start address and an end address of areas in the sub deflection memory 18 in which there are stored related pattern data in the sub field which is related to the coordinate Mx, My and the pointers Pi, Pj. The sub deflection memory 18 also stores data SSx, SSy indicating longitudinal and lateral lengths of the rectangular electron beam, which are to be supplied to the deflector 10 used for varying the beam size via a control system (not shown for the sake of simplicity).

A data bank central processing unit (hereafter simply referred to as data bank CPU) 53 stores data to be stored in the main deflection memory 17 and the sub deflection memory 18. The data bank CPU 53 reads out data from an external memory unit (not shown) such as a magnetic disc unit, and supplies a processor 54 with the read-out data. The processor 54 supplies the data from the data bank CPU 53 to the main deflection memory 17 and the sub deflection memory 18. The processor 54 also calculates information on pattern density such as the number of shots necessary for depicting patterns in each sub field or in each main field, and the exposure time necessary to expose each field. This calculation will be described in detail later.

The stage 14 is driven in the X and Y directions by a motor 20, which is controlled by a motor drive circuit 19 containing a digital signal processor (not shown). A laser interferometer 21 including a He-Ne laser for example, detects current locations (coordinates X, Y ) of the stage 14. The laser interferometer 21 generates one pulse every variation corresponding to $\lambda/48$ or $\lambda/120$ where $\lambda$ is the wavelength of the laser. The generated pulse is supplied to a stage laser interferometer counter 22 (hereafter simply referred to as a counter) together with a laser clock derived from the laser interferometer 21. In synchronism with the laser clock, the counter 22 counts up or down depending on the polarity of the pulse derived from the laser interferometer 21.

Figure 4:
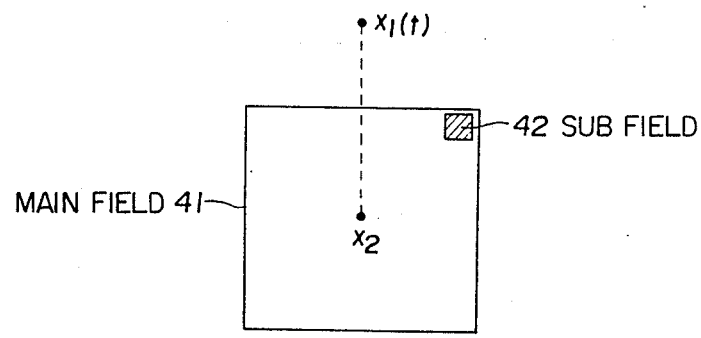
FIG. 4 is a graph of the relationship between an objective position of a stage and a current position of the stage.

An objective stage position register (hereafter simply referred to as a register) 23 registers, as an objective position, the coordinate $x_2$. As shown in FIG. 4, the center of a main field 41 of a rectangular area defined by pattern data should coincide with the center of the column of the apparatus. In FIG. 4, $x_1(t)$ denotes the current coordinate of the stage 14, or in other words, the coordinate at time t, and 42 indicates one of a plurality of sub fields contained in the main field 41. Of course, the apparatus has another register for storing the coordinate $y_2$ as an objective position with respect to the Y coordinate. However, for the sake of simplicity, the register with respect to the Y coordinate is omitted from FIG. 3. Therefore, the following description is given with respect to the X coordinate. A central processing unit (hereafter simply referred to as a CPU) 16 supplies the register 23 with value $x_2$.

The CPU 16 discriminates whether or not the pattern density calculated by the processor 54 exceeds a predetermined value. Then the CPU 16 selects one of the step and repeat mode and the continuous stage moving mode on the basis of the discrimination result.

Figure 5:
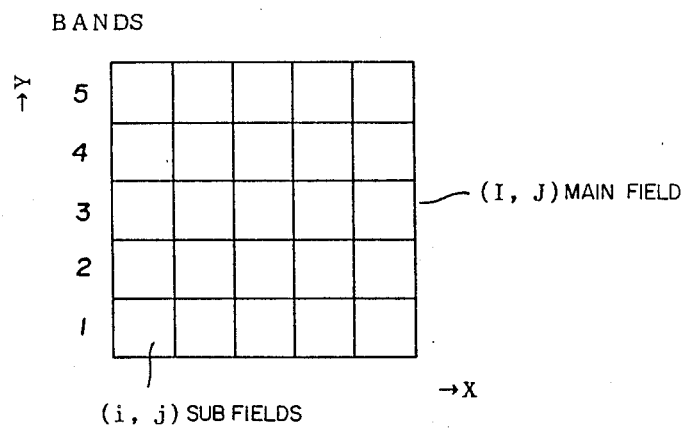
FIG. 5 is a diagram of the main fields included in a wafer and a plurality of sub fields included in the main field.

The processor 54 calculates the pattern density from data supplied from the data bank CPU 53 as follows. FIG. 5 shows a main field which is one of a plurality of main fields on the wafer 15. The illustrated main field is indicated by coordinates (I, J). The main field consists of a plurality of sub fields (25 sub fields in the illustrated example). Each sub field is indicated by coordinates (i, j). The coordinates I and i are concerned with the X direction, and the coordinates J and j are concerned with the Y direction. A band is defined as an alignment consisting of the sub fields in the Y direction within the main field. In the illustrated example, five bands are contained in the main field. The processor 54 calculates the number of exposure shots for every band. It is assumed that the number of exposure shots for a sub field (i, j) in the main field (I, J) is represented as Nsub(i, j, I, J). Therefore, the number, of exposure shots for j-th band is represented as $$\sum_{i=1}^{n} Nsub(j, I, J)$$

where n is the number of sub fields contained in the j-th band. In the illustrate example in FIG. 5, n=5.

Figure 6:
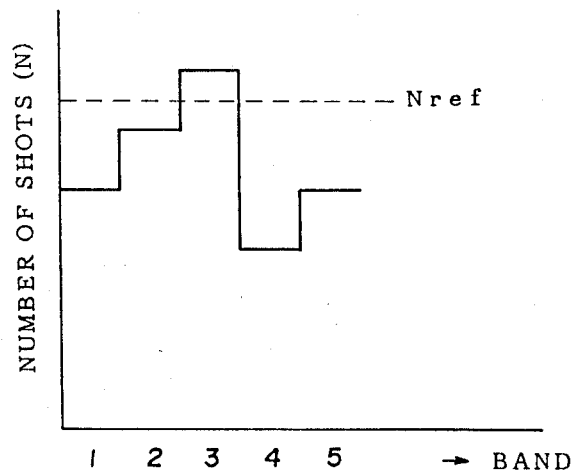
FIG. 6 is a graph showing an example of the number of shots calculated for every band.

FIG. 6 is a graph showing an example of the number of shots calculated for every band. Then the processor 54 compares the number of exposure shots calculated for every band with a predetermined threshold value Nref. Then the processor 54 determines whether the band of concern should be exposed by the step and repeat mode or the continuous stage moving mode on the basis of the comparison result. In FIG. 6, the band 3 has a pattern density greater than the predetermined threshold value Nref. Therefore, the sub fields in the band 3 are exposed by the step and repeat mode, and the remaining sub fields except for the band 3 are exposed by the continuous stage moving mode. In practical exposure operation, after all the bands to be exposed by the continuous stage moving mode are processed, the remaining bands to be exposed by the step and repeat mode are exposed. In the alternative, bands may be exposed in order. That is, when it is discriminated that the band of concern should be exposed by the step and repeat mode, the band is exposed by the step and repeat mode. On the other hand, when it is discriminated that the band of concern should be exposed by the continuous stage moving mode, the band is exposed by the continuous stage moving mode. Although the discrimination of the exposure mode to be selected is carried out for every band, it is also possible to determine the exposure system for every sub field. In this case, the number of shots are calculated for every sub field. Also, it is possible to determine the exposure system for every main field. In this case, an average of the number of shots in each band of the main field is compared with the threshold value Nref. As shown in FIG. 6, the main field (I, J) has a lower average $A_I$ than Nref, and the main field (I+1, J) has a higher average $A_{I+1}$ than Nref.

It should be appreciated that the above-mentioned combination of the two exposure systems can greatly reduce the total exposure time taken to expose a sheet of wafer. That is, the total exposure time $T_{total}$ taken to expose a sheet of wafer can be represented as follows:

$$T_{total} = T_{shot} \times \sum_i N\text{sub}(i, j, I, J) + \\ T_{tran} \times \sum_i N\text{sub}(i, j, I, J) + T_{mj} \times M + T_{oh} \quad (1)$$

where $T_{shot}$ is a time necessary for one shot, $T_{tran}$ is a time taken for the electron beam to shift from a shot to the next shot, $T_{mj}$ is a main jump time taken for the electron beam to shift from a sub field to the next sub field, and $T_{oh}$ is an overhead time necessary to transport and position the wafer 15. It can be seen from formula (1) that the total exposure time $T_{total}$ depends greatly on the number of shots Nsub(i, j, I, J). Therefore, it is possible to reduce the total exposure time $T_{total}$ by changing the exposure mode depending on Nsub(i, j, I, J).

Turning to FIG. 3, when the pattern density is lower than the predetermined threshold value, the CPU 16 instructs the motor drive circuit 19 so that the motor 20 continuously rotates at a fixed speed. Additionally, the CPU 16 generates a set pulse which is switched to a high level only the moment the exposure process for each sub field starts. The above-mentioned set pulse of the high level is supplied through a signal line 101 to an AND gate 24, which is thereby opened. Therefore, the count value in the counter 22 at that time is allowed to pass through the AND gate 24, and is input to a stage position input register (hereafter simply referred to as a register) 25. Therefore, the current position $x_1(t_0)$ of the stage 14 occurring the moment each sub field starts to be exposed, is input to the register 25.

On the other hand, when the pattern density is equal to or greater than the predetermined threshold value, the CPU 16 controls the motor 20 through the motor drive circuit in such a manner that the stage 14 is kept stationary during a time when the related main field is exposed, and is then driven until the exposure process of the next main field starts after completing the main field. At the same time as the motor drive circuit 19 is controlled in the above-mentioned manner, the CPU 16 supplies the register 22 with a value identical to the objective position $x_2$ stored in the register 23 through a signal line 102, and keeps the AND gate 24 closed by supplying the register 23 with the set signal kept at the low level through the signal line 101. Therefore, at this time, the objective position $x_2$ is input to the register 25.

As described above, when the continuous stage moving mode is selected, the current position of the stage 14 occurring the moment the exposure process for each sub field starts, that is $x_1(t_0)$ is input to the register 25. On the other hand, when the step and repeat mode is selected, the objective position $x_2$ is input to the register 25 the moment the exposure for each sub field starts.

The data input to the register 25 is supplied to difference calculators 27 and 28. The difference calculator 28 calculates a difference between the position $x_1(t_0)$ and the objective position $x_2$ at each sub field exposure starting time, when the continuous stage moving mode is selected. On the other hand, when the step and repeat mode is selected, the difference calculator 28 calculates a difference between the objective position $x_2$ supplied from the register 23 and the value $x_2$ supplied from the register 25. It is noted that in the latter case, the difference calculated by the difference calculator 28 is equal to zero. The difference calculated by the difference calculator 28 is supplied to an adder 29, which is also supplied with the related pattern data Mx. Then the adder 29 adds the difference and the pattern data Mx. During the continuous stage moving mode, the difference $x_2 - x_1(t_0)$ is added to the pattern data Mx. On the other hand, no value is added to the pattern data Mx during the step and repeat mode. The addition result indicates a beam location to be deflected by the main deflector 12. Then the addition result is supplied to a main field distortion correction memory 33, and a correction operation circuit 32. The main field distortion correction memory 33 stores distortion data used for correcting distortion with respect to gain, rotation, trapizoid, and offset. The distortion data is read out from the main field distortion correction memory 33, and is supplied to the correction operation circuit 32. Then the correction operation circuit 32 corrects data supplied from the adder 29 by referring to the distortion data. The correction operation performed in the correction operation circuit 32 is defined as follows:

$$X' = Gx \cdot X + Rx \cdot Y + Hx \cdot X \cdot Y + Ox \quad (2)$$

$$Y' = Gy \cdot Y + Ry \cdot X + Hy \cdot X \cdot Y + Oy \quad (3)$$

where X and Y denote data supplied from the adder 29 and the adder (not shown) with respect to the Y coordinate, Gx and Gy are gain correction coefficients, Rx and Ry are rotation correction coefficients, Hx and Hy are trapizoid correction coefficients, Ox and Oy are offset correction coefficients, and X' and Y' are corrected data. The corrected data X' defined by the formula (2) is supplied to a main deflection digital-to-analog converter (hereafter simply referred to a main deflection DAC) 34x with respect to the coil 12x of the main deflector 12. Similarly, the corrected data Y' defined by the formula (3) is supplied to a main deflector DAC 34y with respect to the coil 12y of the main deflector 12. The main deflection DACs 34x and 34y convert the corrected data in digital form to analog signals, which are supplied to the coils 12x and 12y, respectively.

A pattern generator 30 generates an exposure clock (shot time) related to pattern data to be depicted on the wafer 15 with respect to the sub field indicated by the pattern data Sx, Sy. The exposure clock derived from the pattern generator 30 is supplied to a sub deflection correction operation circuit 31, to which the pattern data Sx, Sy and distortion data are also supplied from the sub deflection memory 18 and the main field distortion correction memory 33, respectively. The sub deflection correction operation circuit 31 performs correction operations based on the above-mentioned formulas (2) and (3) in which data X and Y are substituted with data Sx and Sy. The corrected pattern data is supplied to a sub deflection DAC 39, which converts the corrected pattern data into an analog signal in synchronism with the exposure clock supplied from the pattern generator 30. The analog output signal of the sub deflection DAC 39 represents patterns to be exposed in the related sub field.

On the other hand, the difference calculator 27 is supplied with the current coordinate $x_1(t)$ from the counter 22 and the coordinate $x_1(t_0)$ or $x_2$. At the time when the continuous stage moving mode is selected, the difference calculator 27 calculates the difference between the coordinate $x_1(t_0)$ and the coordinate $x_1(t)$. At the time when the step and repeat mode is selected, the difference calculator 27 calculates the difference between the objective position $x_2$ and the coordinate $x_1(t)$. The calculated difference is supplied to a correction operation stage feedback circuit 36, to which distortion data is supplied from the main field distortion memory 33. The correction operation stage feedback circuit 36 performs the conventional correction operation with respect to focusing, astigmatism, and so on. The output signal of the correction operation stage feedback circuit 36 is converted into an analog signal by a stage feedback DAC 37. The converted analog signal is supplied to a sub deflection amplifier 38, to which the analog signal is supplied from the sub deflection DAC 39. The sub deflection amplifier 38 adds the analog signal from the stage feedback DAC 37 to the analog signal from the sub deflection DAC 39. The difference amplifier 27, the correction operation stage feedback circuit 36 and the stage feedback DAC 37 operate in synchronism with the laser clock generated by the laser interferometer 21. It is noted that the analogical adding operation in the sub deflection amplifier 38 is employed in the illustrated embodiment because there is no relationship between the exposure clock and the laser clock. If the output of the sub deflection correction circuit 31 is added, in digital form, to the correction operation stage feedback circuit 36, errors may frequently occur which may cause jumping of shots.

In the embodiment of the present invention, when the pattern density is less than the predetermined threshold value, or in other words, when the continuous stage moving mode is selected, a correction amount with respect to sub deflection is determined by the difference between the current stage position $X_1(t)$ and the stage position $X_1(t_0)$ obtained each time the exposure process for the sub field starts. In addition, a correction amount with respect to the main deflection is determined by the difference between the objective position $x_2$ and the stage position $x_1(t_0)$.

On the other hand, when the pattern density is equal to or greater than the predetermined threshold value, or in other words, when the step and repeat mode is selected, a correction amount with respect to the main deflection is intentionally set equal to zero, and a correction amount with respect to the sub deflection is determined by the difference between the objective position $x_2$ and the current stage position $x_1(t)$.

Figure 7:
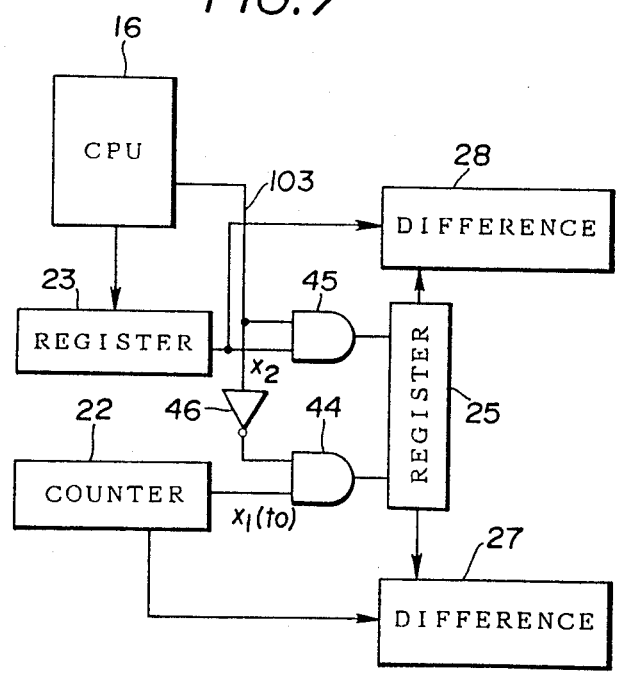
FIG. 7 is a block diagram of a variation of the embodiment shown in FIG. 3.

A variation of the aforementioned embodiment is described by referring to FIG. 7. The illustrated circuit is a peripheral circuit of the register 25. In FIG. 7, those parts which are the same as those corresponding parts in FIG. 3, are given the same reference numerals. Referring to FIG. 7, there are provided two AND gates 44 and 45 each having two inputs. The AND gate 44 is supplied with the coordinate $x_1(t_0)$ derived from the counter 22, and the AND gate 45 is supplied with the objective position $x_2$ supplied from the register 23. The CPU 16 continues to generate a control signal kept at the high level during the time when the step and repeat mode is selected. The above-mentioned control signal is supplied, through a signal line 103, to the AND gate 45, and is supplied to the AND gate 44 through an inverter 46. During the time when the control signal is kept at the high level, the AND gate 45 is kept open, and the AND gate 44 is kept closed. With this structure, it becomes possible to take the objective position $x_2$ in the register 25. On the other hand, during the time when the continuous stage moving mode is selected, the CPU 16 generates the control signal having a low level and having a short period, only when the exposure process for each sub field starts. Thereby, the coordinate $x_1(t_0)$ obtained at that time is input to the register 25 through the AND gate 44.

The present invention is not limited to the above-mentioned embodiments, and variations and modifications may be made without departing from the scope of the present invention.

What is claimed is:

1. A method for depicting a pattern on a sample having a plurality of exposure areas placed on a movable stage by irradiating an electron beam, said method comprising the steps of:
   (a) calculating a pattern density in each exposure area from data of a pattern to be exposed;
   (b) comparing the calculated pattern density with a predetermined threshold value;
   (c) depicting the pattern in a first exposure area of the exposure areas in which the sample is exposed while continuously moving the stage when the calculated pattern density in the first exposure area is less than the predetermined threshold value; and
   (d) depicting the pattern in a second exposure area of the exposure areas by a step and repeat process when the calculated pattern density in the second exposure area is equal to or greater than the predetermined threshold value.

2. A method as claimed in claim 1, wherein said step (d) for depicting the pattern in the second exposure area by the step and repeat process is carried out after the entire first exposure area is exposed by the continuous stage moving process.

3. A method as claimed in claim 1, wherein when said step (d) determines that the exposure area of concern about to be exposed should be exposed by the step and repeat process, said step (d) for depicting said pattern by the step and repeat process is immediately carried out without proceeding to the next exposure area to be exposed by the continuous stage moving process.

4. A method as claimed in claim 1, wherein said step (a) of calculating pattern density includes the substep of calculating a number of shots corresponding to a number of times that the electron beam is repeatedly projected onto each of the exposures areas.

5. A method as claimed in claim 1, wherein each of the exposure areas corresponds to a main deflection field divided into a plurality of sub-deflection fields.

6. An electron beam exposure apparatus for depicting a pattern on a sample having a plurality of exposure areas by irradiating an electron beam onto the sample, said electron beam exposure apparatus comprising:
  a stage on which the sample is placed;
  electron beam generating means for generating the electron beam;
  deflection means, coupled to said electron beam generating means, for deflecting the electron beam generated by said electron beam generating means;
  deflection signal generating means, coupled to said deflection means, for providing said deflection means with a deflection signal based on pattern data relating to a pattern to be exposed;
  stage drive means, operatively connected to said stage, for driving said stage; and
  control means, operatively connected to said stage drive means and said deflection signal generating means, for discriminating whether or not a pattern density obtained from said pattern data is equal to or greater than a predetermined threshold value and supplying said stage drive means with a control signal for intermittently moving said stage when the obtained pattern density is equal to or greater than the predetermined threshold value and for supplying said stage drive means with said control signal for continuously moving said stage when the obtained pattern density is less than the predetermined threshold value.

7. An electron beam exposure apparatus as claimed in claim 6, wherein said deflection means comprises:
  a main deflector; and
  a sub-deflector operatively connected to said main deflector,
  wherein said deflection signal comprises first and second deflection signals;
  wherein said deflection signal generating means comprises:
  first deflection signal generating means for supplying said first deflection signal with said main deflector; and
  second deflection signal generating means for supplying said second deflection signal with said sub-deflector; and
  wherein said apparatus further comprises:
  stage position detecting means, operatively connected to second stage, for generating coordinate data indicating a current position of said stage;
  first storage means, operatively connected to said stage, for storing said coordinate data indicating the current position of said stage;
  second storage means, operatively connected to said stage, for storing coordinate data of an objective position for said stage at which a center of each of said exposure areas defined by said pattern data coincides with a column center of said stage;
  coordinate data input register means, operatively connected to said control means, said second storage means and said first storage means, for receiving coordinate data of said objective position stored in said second storage means when the pattern density obtained from said pattern data to be exposed is equal to or greater than the predetermined threshold value and for receiving at a predetermined time, coordinate data indicating the current position stored in said first storage means when the pattern density obtained from said pattern data is less than the predetermined threshold value;
  first difference calculating means, operatively connected to said coordinate data input register means and said first storage means, for calculating a first difference between coordinate data supplied from said coordinate data input register means and coordinate data stored in said first storage means;
  second difference calculating means, operatively connected to said coordinate data input register means and said second storage means, for calculating a second difference between coordinate data supplied from said coordinate data input register means and coordinate data stored in said second storage means;
  first adjustment means, operatively connected to said second deflection signal generating means and said first difference calculating means, for adjusting said second deflection signal from said second deflection signal generating means in accordance with said first difference from said first difference calculating means; and
  second adjustment means, operatively connected to said first deflection signal generating means and said second difference calculating means, for adjusting said first deflection signal from said first deflection signal generating means in accordance with said second difference from said second difference calculating means.

8. An electron beam exposure apparatus as claimed in claim 7, wherein each of said exposure areas comprises a plurality of sub areas, and said predetermined time is a time when the exposure for each of said plurality of sub areas starts.

9. An electron beam exposure apparatus as claimed in claim 7, wherein when the pattern density is less than the predetermined threshold value, the coordinate data obtained at the predetermined time is input to said coordinate data input register means, and said sample is exposed by a continuous stage moving process for continuously moving said stage drive means, and wherein when the pattern density is equal to or greater than said predetermined threshold value, the coordinate data of said objective position is input to said coordinate data input register means, and said sample is exposed by a step and repeat process for intermittently moving said stage drive means.

10. An electron beam exposure apparatus as claimed in claim 9, wherein when said sample is exposed by the continuous stage moving process, said first difference calculating means calculates the first difference between coordinate data from said coordinate data input register means at said predetermined time and coordinate data from said first storage means during exposure, and wherein when said sample is exposed by the step and repeat process, said first difference calculating means calculates the first difference between coordinate data supplied from said coordinate data input register means at said predetermined time and coordinate data supplied from said first storage means during exposure.

11. An electron beam exposure apparatus as claimed in claim 9, wherein when said sample is exposed by the continuous stage moving process, said second difference calculating means calculates the second difference between coordinate data from said coordinate data input register means at said predetermined time and coordinate data from said second storage means, and wherein when said sample is exposed by the step and repeat process, said second difference calculating means calculates the second difference between coordinate data from said coordinate data input register means at said predetermined time and coordinate data from said second storage means.

12. An electron beam exposure apparatus as claimed in claim 6, wherein said control means calculates said pattern density by calculating the number of shots for every predetermined area included in said sample by using said pattern data used for depicting said pattern on said sample.

13. An electron beam exposure apparatus as claimed in claim 7, wherein said coordinate data input register means comprises an AND gate having a first input connected to said first storage means and a second input connected to said control means.

14. An electron beam exposure apparatus as claimed in claim 7, wherein said coordinate data input register means comprises:
 a register connected to said control means;
 an inverter connected to said control means;
 a first AND gate operatively connected to said control means; and
 a second AND gate operatively connected to said register;
 wherein said second storage means is coupled to said register through said first AND gate connected; and
 wherein said first storage means is coupled to said register through said second AND gate.

15. An electron beam exposure apparatus as claimed in claim 7, wherein said stage position detecting means and said first difference calculating means are synchronized with each other.

* * * * *